United States Patent
Tsai et al.

(10) Patent No.: US 10,872,970 B2
(45) Date of Patent: Dec. 22, 2020

(54) SOURCE AND DRAIN FORMATION TECHNIQUE FOR FIN-LIKE FIELD EFFECT TRANSISTOR

(71) Applicant: Taiwan Semiconductor Manufacturing Co., Ltd., Hsinchu (TW)

(72) Inventors: Chun Hsiung Tsai, Hsinchu County (TW); Kuo-Feng Yu, Hsinchu County (TW); Ziwei Fang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/587,754

(22) Filed: Sep. 30, 2019

(65) Prior Publication Data

US 2020/0035812 A1  Jan. 30, 2020

Related U.S. Application Data

(63) Continuation of application No. 15/481,211, filed on Apr. 6, 2017, now Pat. No. 10,431,670.

(60) Provisional application No. 62/434,631, filed on Dec. 15, 2016.

(51) Int. Cl.
| | |
|---|---|
| *H01L 29/66* | (2006.01) |
| *H01L 29/167* | (2006.01) |
| *H01L 21/225* | (2006.01) |
| *H01L 21/324* | (2006.01) |
| *H01L 29/08* | (2006.01) |

(52) U.S. Cl.
CPC .... *H01L 29/66795* (2013.01); *H01L 21/2254* (2013.01); *H01L 21/2257* (2013.01); *H01L 21/324* (2013.01); *H01L 29/167* (2013.01); *H01L 29/6656* (2013.01); *H01L 29/66545* (2013.01); *H01L 29/0847* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0245583 | A1* | 12/2004 | Horiuchi | ............. H01L 27/0623 257/408 |
| 2014/0091371 | A1* | 4/2014 | Son | ........................ H01L 29/78 257/288 |
| 2015/0198775 | A1* | 7/2015 | Sandhu | .................... G02B 6/42 385/14 |

(Continued)

*Primary Examiner* — Moin M Rahman
(74) *Attorney, Agent, or Firm* — Haynes and Boone, LLP

(57) ABSTRACT

Source and drain formation techniques for fin-like field effect transistors (FinFETs) are disclosed herein. An exemplary method includes forming a fin structure, wherein the fin structure include a channel region disposed between a source region and a drain region; forming a gate structure over the channel region of the fin structure; forming a solid phase diffusion (SPD) layer over the source region and the drain region of the fin structure; and performing a microwave annealing (MWA) process to diffuse a dopant from the SPD layer into the source region and the drain region of fin structure. In some implementations, the SPD layer is disposed over the fin structure, such that the dopant diffuses laterally and vertically into the source region and the drain region to form heavily doped source/drain features.

20 Claims, 9 Drawing Sheets

(56) References Cited

U.S. PATENT DOCUMENTS

2015/0318381 A1* 11/2015 Tsai .................. H01L 29/66636
                                                                438/283
2017/0117409 A1* 4/2017 Balakrishnan ...... H01L 29/7848

* cited by examiner

SOURCE AND DRAIN FORMATION TECHNIQUE FOR FIN-LIKE FIELD EFFECT TRANSISTOR

PRIORITY

The present application is a continuation application of U.S. patent application Ser. No. 15/481,211, filed Apr. 6, 2017, which claims the benefit of U.S. Provisional Patent Application Ser. No. 62/434,631, filed Dec. 15, 2016, each of which is hereby incorporated herein by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as fin-like field effect transistor (FinFET) technologies progress towards smaller feature sizes (such as 32 nanometers, 28 nanometers, 20 nanometers, and below), FinFET fabrication processes are significantly constrained by decreasing process margins. In particular, decreasing fin pitches and increasing fin heights are significantly constraining abilities of existing source and drain formation techniques to fabricate source and drain features that optimize FinFET device performance. Accordingly, although existing source and drain formation techniques have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-7A, FIGS. 2B-7B, and FIGS. 5C-6C are fragmentary diagrammatic views of a FinFET device, in portion or entirety, at various fabrication stages (such as those associated with the method of FIG. 1) according to various aspects of the present disclosure.

DETAILED DESCRIPTION

Figure 1:
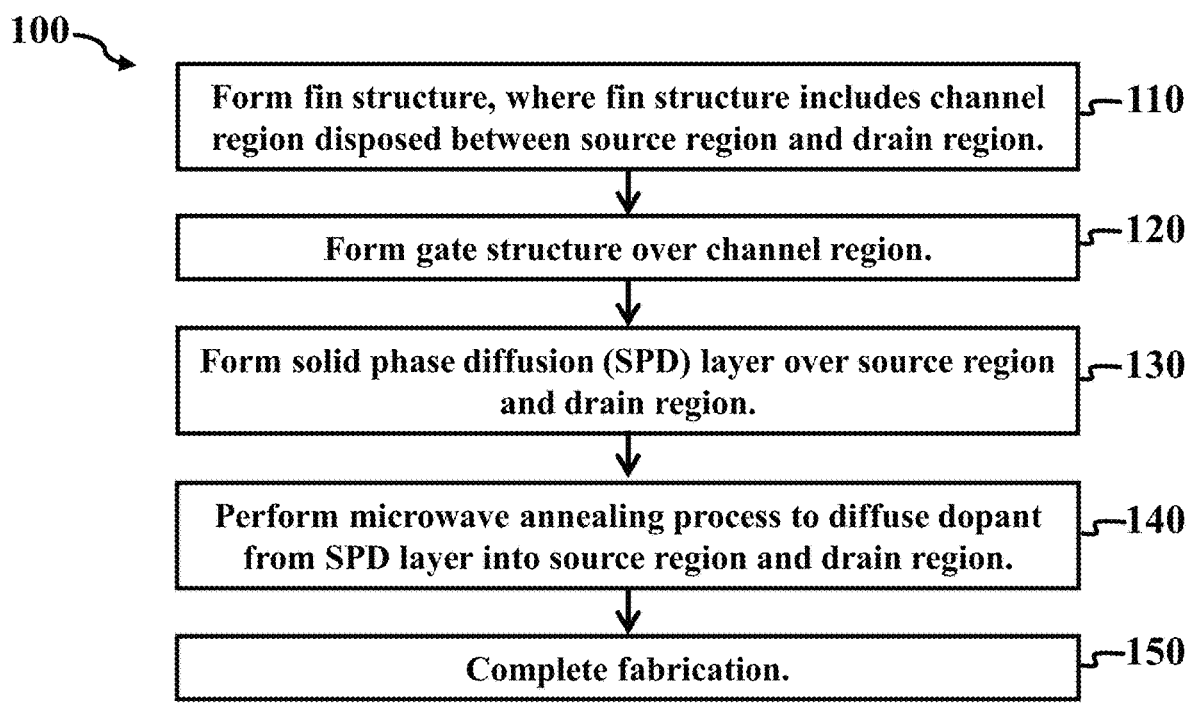
FIG. 1 is a flow chart of a method for fabricating a fin-like field effect transistor (FinFET) device according to various aspects of the present disclosure.

The present disclosure relates generally to integrated circuit devices, and more particularly, to fin-like field effect transistor (FinFET) devices and techniques for forming doped features (for example, source features and drain features) for FinFETs.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

As FinFET technologies progress towards smaller technology nodes (such as 16 nm, 10 nm, 7 nm, 5 nm, and below), decreasing fin pitch and increasing fin height are placing significant constraints on traditional source and drain formation techniques. As one example, ion implantation processes applied vertically to a top of a fin structure result in a dopant concentration along a top portion of the fin structure that is greater than a dopant concentration along sidewall portions of the fin structure, such that the FinFET device will not satisfactorily conduct current during operation. Though directional ion implantation processes applied at an angle to the fin structure have been implemented to overcome such challenges, tilt angles are constrained by fin height and fin pitch associated with smaller technology nodes (as well as by a height of masking elements (for example, resist layers) used to cover nearby features during the ion implantation process), such that a top portion of the fin structure has a greater dopant concentration than a bottom portion of the fin structure. Shadowing effects caused by ion implantation processes are thus hindering the formation of uniformly doped source/drain features. In another example, to overcome shadowing effects, a fin structure is often recessed in the source region and the drain region, and then, ion implantation processes and/or diffusion processes are performed to form doped features in the fin structure before growing epitaxial source/drain features from the recessed fin structure. However, it has been observed that epitaxial source/drain features formed on adjacent fins are beginning to undesirably merge as fin pitch decreases, presenting significant processing challenges.

The disclosed source and drain formation techniques overcome such challenges. As discussed extensively below, the disclosed source and drain formation techniques achieve doped source/drain features that exhibit substantially uniform dopant concentrations along top portions and sidewall portions of a fin structure, thereby maximizing FinFET device operation.

FIG. 1 is a flow chart of a method 100 for fabricating an integrated circuit device according to various aspects of the present disclosure. In the present embodiment, method 100 fabricates an integrated circuit device that includes a FinFET device. At block 110, method 100 includes forming a fin structure, where the fin structure includes a channel region disposed between a source region and a drain region. At block 120, a gate structure is formed over the channel region of the fin structure. At block 130, a solid phase diffusion layer is formed over the source region and the drain region of the fin structure. In some implementations, the solid phase diffusion layer is configured to form strained source/drain features for the FinFET device, such as epitaxial source/drain features disposed over the fin structure. At block 140, a microwave annealing process is performed to diffuse a dopant from the solid phase diffusion layer into the source region and the drain region of fin structure. In some implementations, the solid phase diffusion layer is disposed over the fin structure, such that the dopant diffuses laterally and vertically into the source region and the drain region to form doped source/drain features in the fin structure during the microwave annealing process. Laterally and vertically diffusing dopant into the source region and the drain region can achieve doped source/drain features that exhibit uniform doping profiles. At block 150, the method 100 may continue to complete fabrication of the FinFET device. In some implementations, a gate replacement process is performed to form a metal gate in the gate structure. Additional steps can be provided before, during, and after method 100, and some of the steps described can be moved, replaced, or eliminated for additional embodiments of method 100. The discussion that follows illustrates various embodiments of a FinFET device that can be fabricated according to method 100.

Figure 4A:
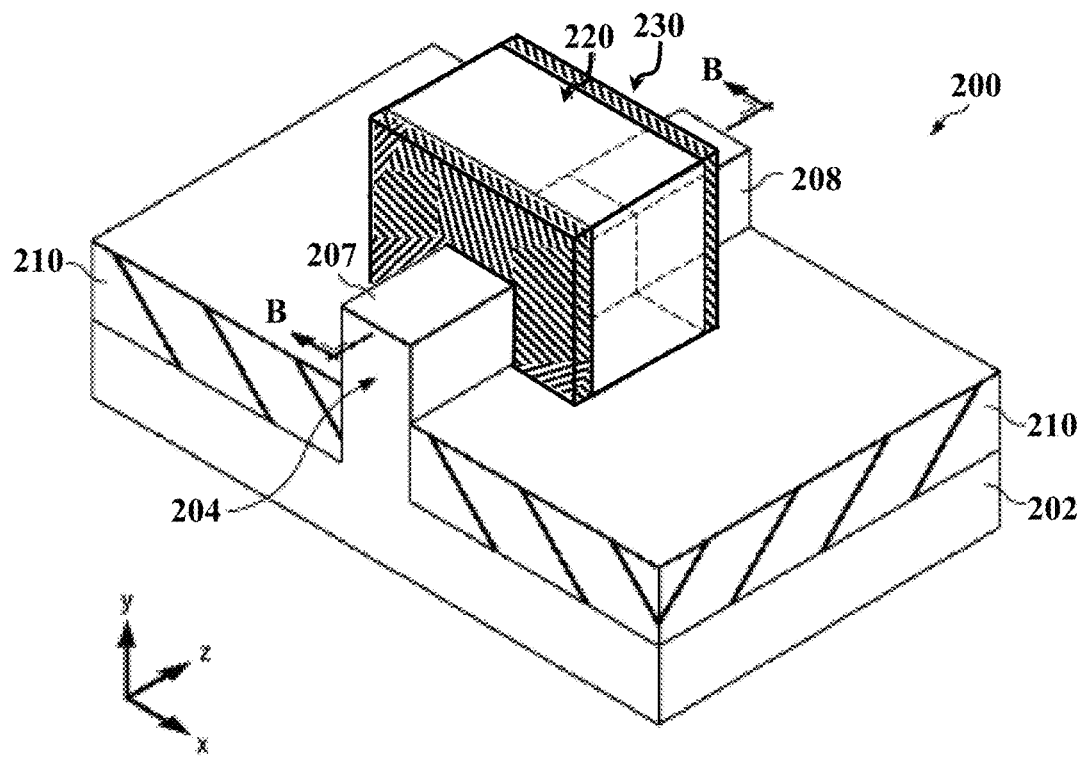
Figure 4B:
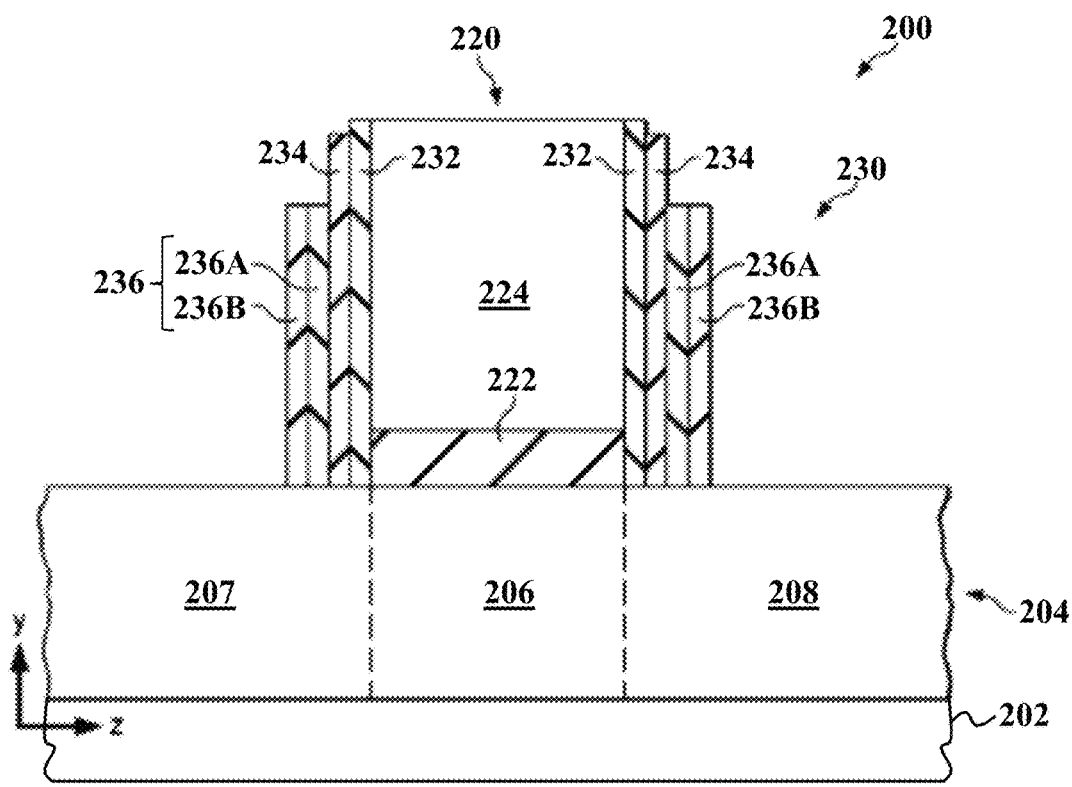
Figure 5A:
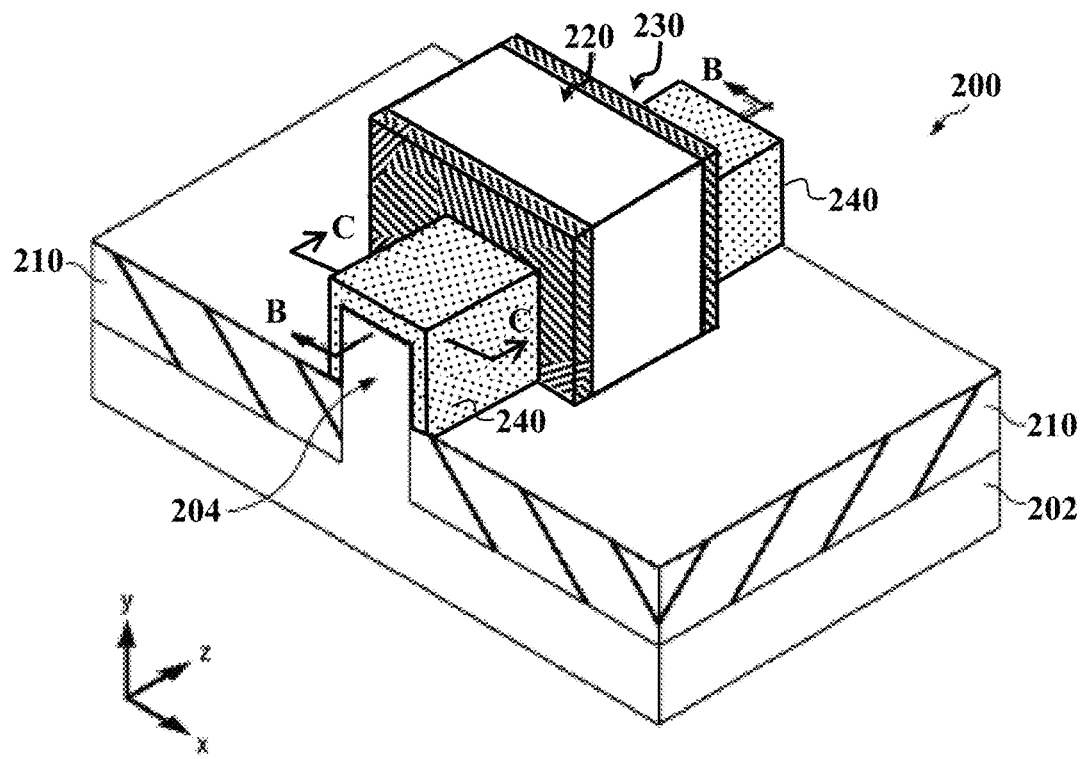
Figure 5B:
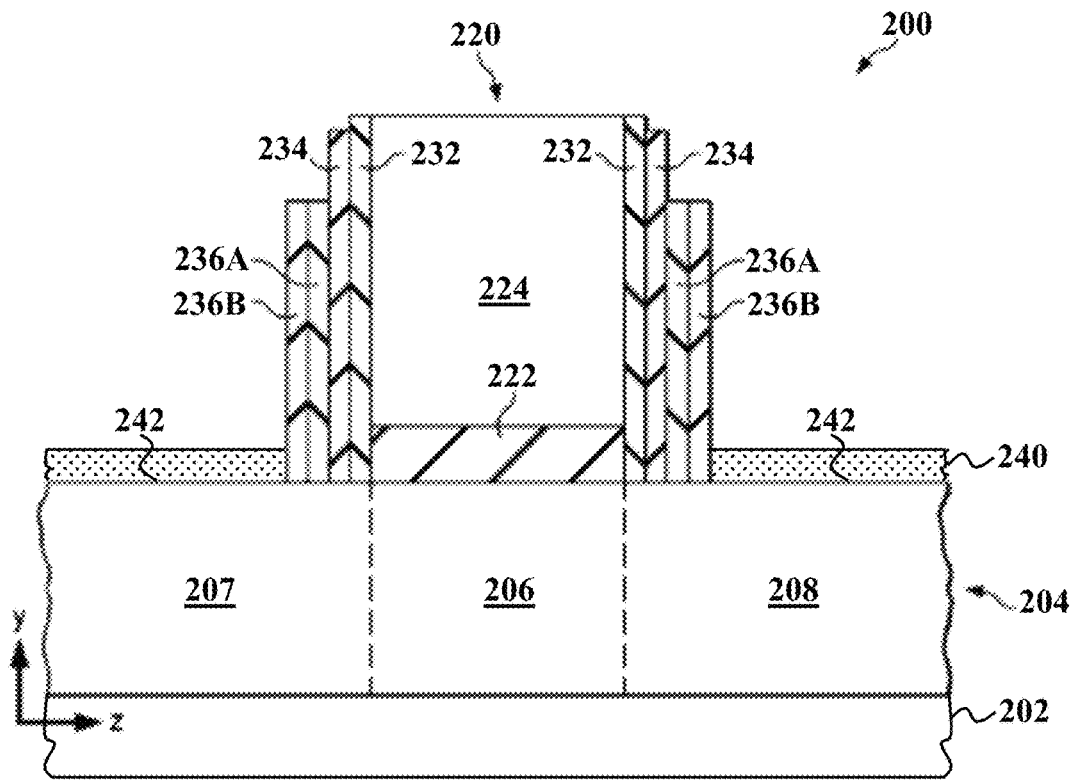
Figure 5C:
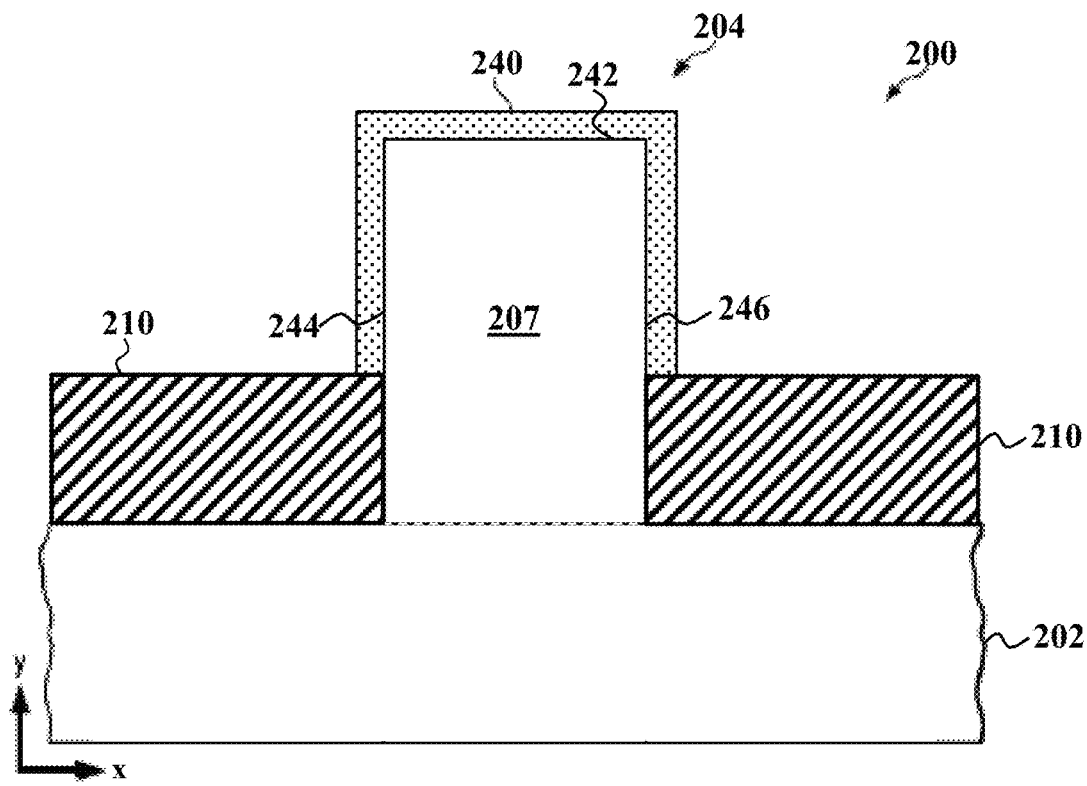
Figure 6C:
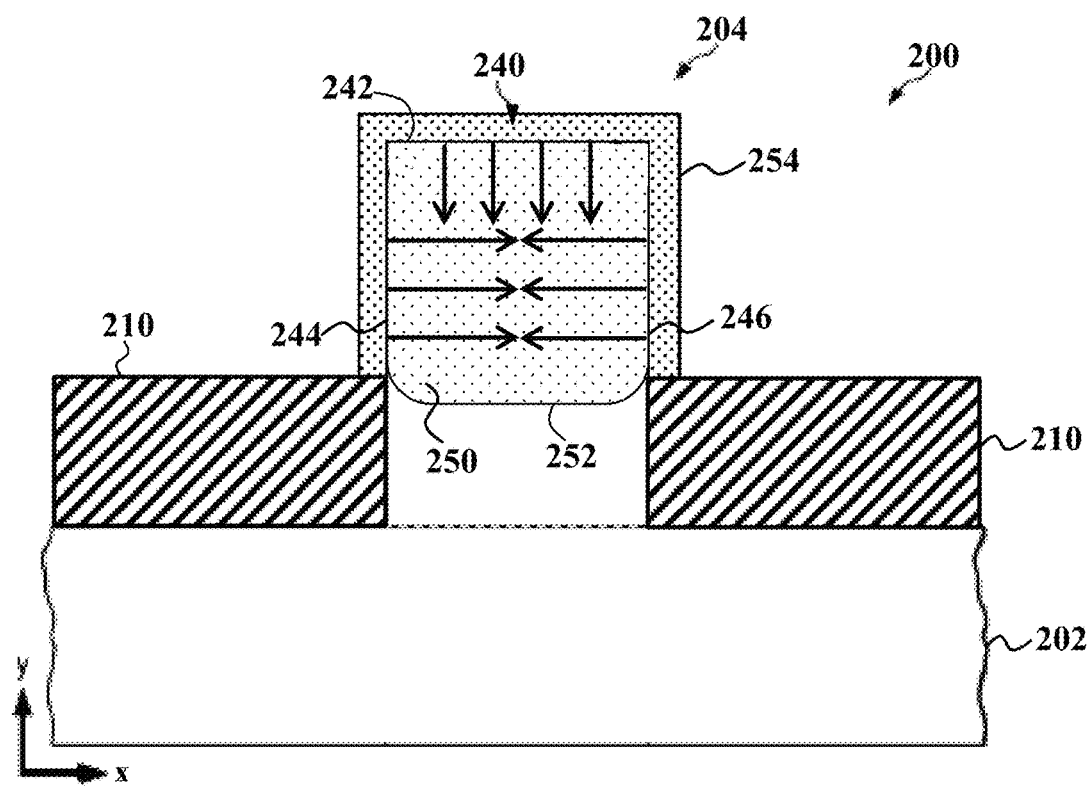

FIGS. 2A-7A, FIGS. 2B-7B, and FIGS. 5C-6C are fragmentary diagrammatic views of a FinFET device 200, in portion or entirety, at various fabrication stages (such as those associated with method 100) according to various aspects of the present disclosure. In particular, FIGS. 2A-7A are perspective, three-dimensional views of FinFET device 200 (for example, in an x-y-z plane); FIGS. 2B-7B are diagrammatic cross-sectional views of FinFET device 200 along line B-B respectively of FIGS. 2A-7A (for example, in a y-z plane); and FIG. 5C and FIG. 6C are diagrammatic cross-sectional views of FinFET device 200 along line C-C respectively of FIG. 5A and FIG. 6A (for example, in an x-y plane). FinFET device 200 generally refers to any fin-based transistor, which can be included in a microprocessor, memory cell, and/or other integrated circuit device. Furthermore, FinFET device 200 may be an intermediate device fabricated during processing of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOSs) transistors, bipolar transistors, high voltage transistors, high frequency transistors, other suitable components, or combinations thereof. FIGS. 2A-7A, FIGS. 2B-7B, and FIGS. 5C-6C have been simplified for the sake of clarity to better understand the inventive concepts of the present disclosure. Additional features can be added in FinFET device 200, and some of the features described below can be replaced, modified, or eliminated in other embodiments of FinFET device 200.

Figure 2A:
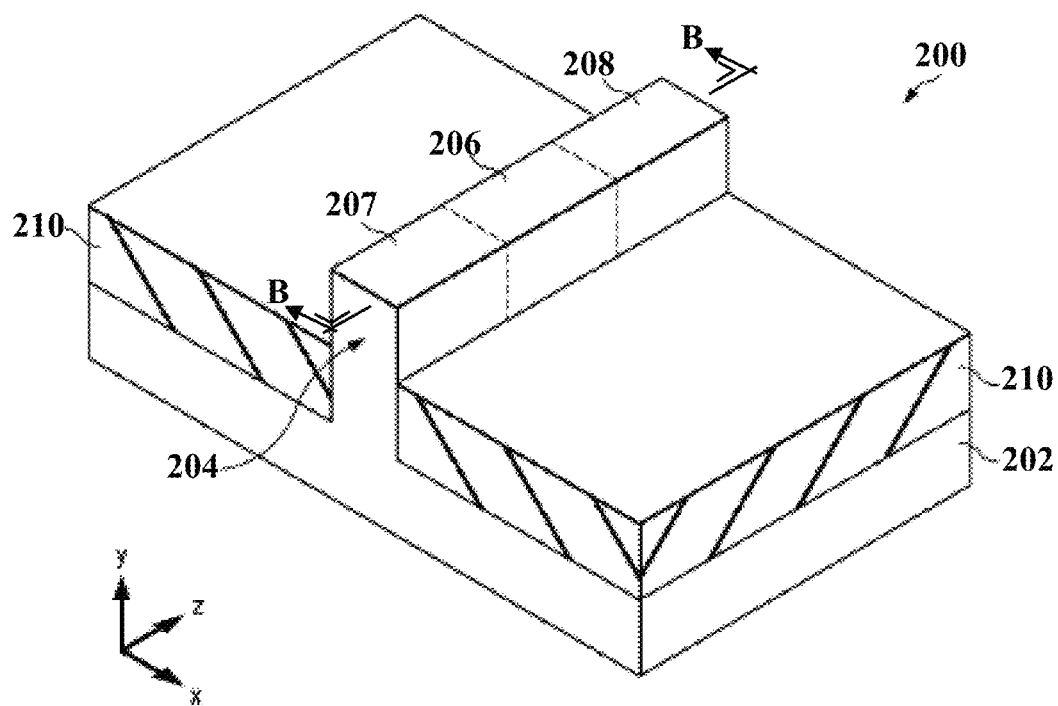
Figure 2B:
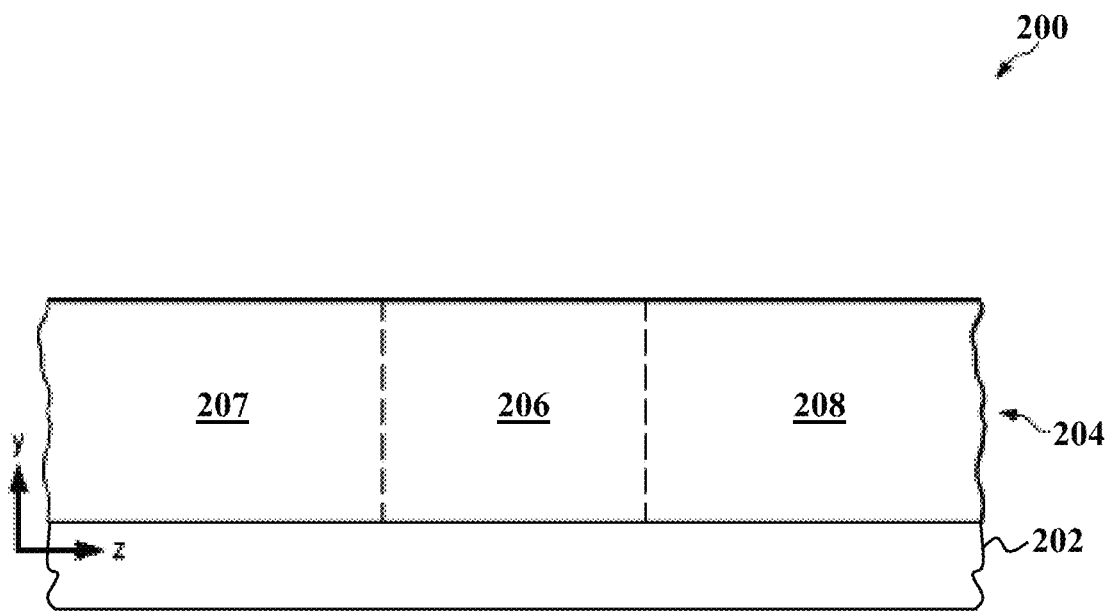

In FIG. 2A and FIG. 2B, FinFET device 200 includes a substrate (wafer) 202. In the depicted embodiment, substrate 202 includes silicon. Alternatively or additionally, the substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions (not shown) depending on design requirements of FinFET device 200. In some implementations, substrate 202 includes p-type doped regions (for example, p-type wells) doped with p-type dopants, such as boron (for example, $BF_2$), indium, other p-type dopant, or combinations thereof. In some implementations, substrate 202 includes n-type doped regions (for example, n-type wells) doped with n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions.

A fin structure 204 is disposed over substrate 202. In FIG. 2A and FIG. 2B, fin structure 204 (also referred to as a fin) extends from substrate 202 in a y-direction, such that fin structure 204 has a height defined in the y-direction, a length defined in a z-direction, and a width defined in an x-direction. Fin structure 204 includes an intrinsic semiconductor material, which generally refers to a semiconductor material that includes a number of electrons substantially equal to a number of holes. In some implementations, the intrinsic semiconductor material is completely free of any dopants (also referred to as undoped semiconductor material). In some implementations, the intrinsic semiconductor material has a dopant concentration less than about $1 \times 10^{17}$ dopants/$cm^3$ ($cm^{-3}$). In the depicted embodiment, fin structure 204 is a portion of substrate 202 that includes intrinsic silicon, such that fin structure 204 includes intrinsic silicon. In some implementations, fin structure 204 is defined in a material layer overlying substrate 202. For example, fin structure 204 can include a semiconductor layer stack having various semiconductor layers (such as a heterostructure) disposed over substrate 202. The semiconductor layers can include any suitable intrinsic semiconductor materials, such as silicon, germanium, silicon germanium, other suitable intrinsic semiconductor materials, or combinations thereof. The semiconductor layers can include same or different materials, etching rates, constituent atomic percentages, constituent weight percentages, thicknesses, and/or configurations depending on design requirements of FinFET device 200.

A channel region 206, a source region 207, and a drain region 208 are defined along the length of fin structure 204 (here, along the z-direction), where channel region 206 is disposed between source region 207 and drain region 208 (generally referred to as source/drain regions). Channel region 206 includes a top portion defined between sidewall portions, where the top portion and the sidewall portions engage with a gate structure (as described below), such that current can flow between source region 207 and drain region 208 during operation of FinFET device 200. Source region 207 and drain region 208 also include top portions defined between sidewall portions. In some implementations, the top portions of channel region 206, source region 207, and drain region 208 are a substantially horizontal side or surface (for example, substantially parallel to an x-z plane) of fin structure 204, while the sidewall portions of channel region 206, source region 207, and drain region 208 are substantially vertical sides or surfaces (for example, substantially parallel to a y-z plane) of fin structure 204.

Fin structure 204 is formed over substrate 202 using any suitable process. In some implementations, a combination of deposition, lithography and/or etching processes are performed to define fin structure 204 extending from substrate 202 as illustrated in FIG. 2A and FIG. 2B. For example, forming fin structure 204 includes performing a lithography process to form a patterned resist layer over substrate 202 (or a material layer disposed over substrate 202) and performing an etching process to transfer a pattern defined in the patterned resist layer to substrate 202 (or the material layer disposed over substrate 202). The lithography process can include forming a resist layer on substrate 202 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of substrate 202 (or a material layer disposed over substrate 202. The etching process can include a dry etching process (for example, a reactive ion etching (RIE) process), a wet etching process, other suitable etching process, or combinations thereof. After the etching process, the patterned resist layer is removed from substrate 202, for example, by a resist stripping process. Alternatively, fin structure 204 is formed by a double patterning lithography (DPL) process, which is a method of constructing a pattern on a substrate by dividing the pattern into two interleaved patterns. DPL allows enhanced IC feature (for example, fin) density. Various DPL methodologies may be used including double exposure (such as using two mask sets), forming spacers adjacent to features and removing the features to provide a pattern of spacers, resist freezing, other suitable processes, or combinations thereof. Alternatively, the exposure process can be implemented or replaced by other methods, such as maskless lithography, electron-beam (e-beam) writing, ion-beam writing, and/or nanoimprint technology.

An isolation feature(s) 210 is formed over and/or in substrate 202 to isolate various regions, such as various device regions, of FinFET device 200. For example, isolation features 210 separate and isolate fin structure 204 from other fin structures (not shown) formed over substrate 202. In the depicted embodiment, isolation features 210 surround a portion of fin structure 204, such as a bottom portion. Isolation features 210 include silicon oxide, silicon nitride, silicon oxynitride, other suitable isolation material, or combinations thereof. Isolation features 210 can include different structures, such as shallow trench isolation (STI) structures, deep trench isolation (DTI) structures, and/or local oxidation of silicon (LOCOS) structures. In some implementations, isolation features 210 include STI features that define and electrically isolate fin structure 204 from other active device regions and/or passive device regions. For example, STI features can be formed by etching a trench in substrate 202 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features 210. In another example, STI features can be formed by depositing an insulator material over substrate 202 after forming fin structure 204 (in some implementations, such that the insulator material layer fills gaps (trenches) between fin structures 204) and etching back the insulator material layer to form isolation features 210. In some embodiments, STI features include a multi-layer structure that fills the trenches, such as a silicon nitride layer disposed over an oxide liner layer.

Figure 3A:
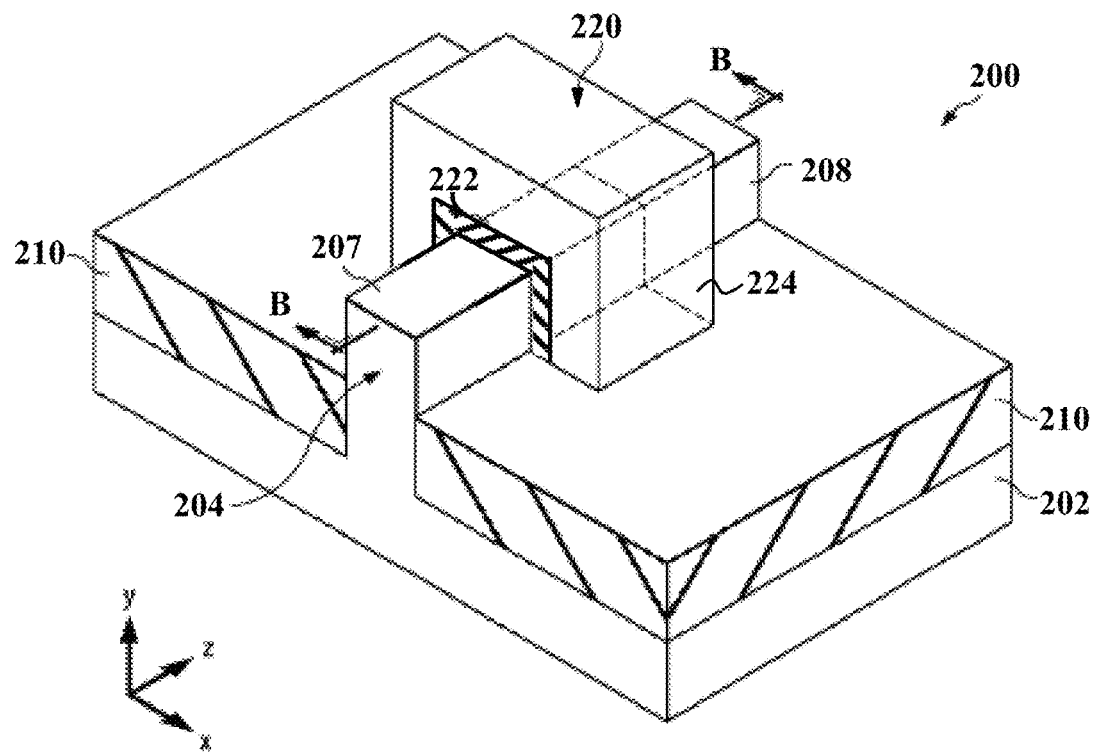
Figure 3B:
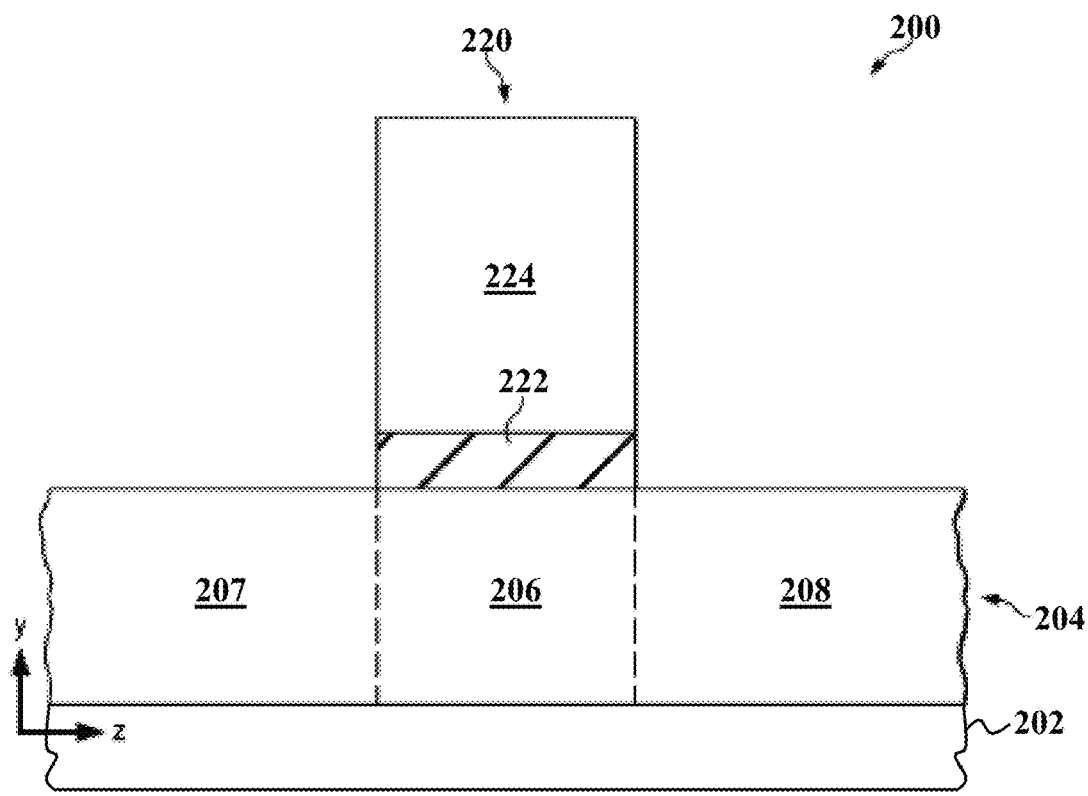

In FIG. 3A and FIG. 3B, a gate structure 220 is formed over fin structure 204. Gate structure 220 wraps a portion of fin structure 204, thereby engaging fin structure 204. In FIG. 3A, gate structure 220 engages the top portion and the sidewall portions of channel region 206, such that gate structure 220 engages three sides of channel region 206. Gate structure 220 interposes source region 207 and drain region 208. In the depicted embodiment, gate structure 220 includes a dummy gate stack configured to wrap fin structure 204 (in particular, channel region 206), such as an interfacial layer 222 and a dummy gate electrode layer 224. Interfacial layer 222 is disposed between dummy gate electrode layer 224 and fin structure 204. Interfacial layer 222 includes a dielectric material, such as silicon oxide, and dummy gate electrode layer 224 includes a dummy gate material, such as polysilicon. The dummy gate stack can include numerous other layers, for example, capping layers, interface layers, diffusion layers, barrier layers, hard mask layers, or combinations thereof. For example, a capping layer, such as a titanium nitride (TiN) capping layer, can be disposed between interfacial layer 222 and dummy gate electrode layer 224. In some implementations, the dummy gate stack further includes a dummy gate dielectric layer disposed between interfacial layer 222 and dummy gate electrode layer 224. The dummy gate dielectric layer includes a dielectric material (for example, silicon oxide), high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, interfacial layer 222 is omitted from the dummy gate stack, such that the dummy gate dielectric layer is disposed between fin structure 204 and dummy gate electrode layer 224.

Gate structure 220 is formed by deposition processes, lithography processes, etching processes, other suitable processes, or combinations thereof. For example, in FIG. 3A and FIG. 3B, a deposition process can be performed to form an interfacial layer over substrate 202, particularly over fin structure 204 and isolation features 210, and a deposition process can be performed to form a dummy gate electrode layer over the interfacial layer. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atomic layer CVD (ALCVD), atmospheric pressure CVD (APCVD), plating, other suitable methods, or combinations thereof. In some implementations, before forming the dummy gate electrode layer, a deposition process is performed to form a dummy gate dielectric layer over the interfacial layer. A lithography patterning and etching process can then performed to pattern the interfacial layer and the dummy gate electrode layer (and, in some implementations, the dummy gate dielectric layer) to form gate structure 220. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof.

In FIG. 4A and FIG. 4B, a spacer structure 230 is formed adjacent to the dummy gate stack of gate structure 220 (here, interfacial layer 222 and dummy gate electrode layer 224). In the depicted embodiment, spacer structure 230 includes seal spacers 232, offset spacers 234, and dummy spacers 236 formed adjacent to the dummy gate stack, such that seal spacers 232, offset spacers 234, and dummy spacers 236 wrap fin structure 204. Seal spacers 232 are disposed adjacent to (for example, along sidewalls of) interfacial layer 222 and dummy gate electrode layer 224; offset spacers 234 are disposed adjacent to (for example, along sidewalls of) seal spacers 232; and dummy spacers 236 are disposed adjacent to (for example, along sidewalls of) offset spacers 234. Seal spacers 232, offset spacers 234, and dummy spacers 236 each include a dielectric material, such as silicon oxide, silicon nitride, silicon oxynitride, silicon carbide, other suitable material, or combinations thereof. Seal spacers 232, offset spacers 234, and dummy spacers 236 include materials having different etching rates. In some implementations, seal spacers 232, offset spacers 234, and/or dummy spacers 236 include a multi-layer structure. For example, in the depicted embodiment, dummy spacers 236 have a multi-layer structure, such as a dummy spacer layer 236A that includes silicon nitride and a dummy spacer layer 236B that includes silicon oxide. Seal spacers 232, offset spacers 234, and dummy spacers 236 are formed by any suitable process. For example, a silicon oxide layer can be deposited over fin structure 204 and subsequently anisotropically etched (for example, dry etched) to form seal spacers 232, and a silicon nitride layer can be deposited over fin structure 204 and subsequently etched (for example, dry etched) to form offset spacers 234. Dummy spacers 236 may be formed by a similar process. During the etching processes, spacer material is removed from a portion of fin structure 204, more particularly, a portion of source region 207 and drain region 208. Implantation, diffusion, and/or annealing processes may be performed to form lightly doped source and drain (LDD) features in fin structure 204 before and/or after forming seal spacers 232, offset spacers 234, and/or dummy spacers 236. However, as discussed further below, FinFET device 200 is fabricated in a manner that achieves uniformly doped source and drain features that eliminate the need for LDD features, without degrading device performance.

In FIGS. 5A-5C, epitaxial source features and epitaxial drain features (referred to as epitaxial source/drain features) are respectively formed over source region 207 and drain region 208 of fin structure 204. For example, a selective epitaxial growth (SEG) process is performed to grow a semiconductor material on exposed portions of fin structure 204, thereby forming epitaxial source/drain features 240 over source region 207 and drain region 208. Epitaxial source/drain features 240 are heavily doped with n-type dopants and/or p-type dopants, such that epitaxial source/drain features 240 are configured to function as solid phase diffusion (SPD) layers. For ease of description, epitaxial source/drain features 240 are thus referred to as SPD source/drain features 240 hereinafter. In some implementations, SPD source/drain features 240 are heavily doped with a dopant having a dopant concentration in a range from about $1 \times 10^{21}$ cm$^{-3}$ to about $4 \times 10^{21}$ cm$^{-3}$. As depicted, SPD source/drain features 240 wrap (cover) source region 207 and drain region 208, such that SPD source/drain features 240 also function as a cladding layer. For example, source region 207 and drain region 208 include a top surface 242 defined between sidewall surfaces (here, a sidewall surface 244 and a sidewall surface 246), where SPD source/drain features 240 are disposed on top surface 242, sidewall surface 244, and sidewall surface 246. In some implementations, top surface 242 is a substantially horizontal side (for example, substantially parallel to the x-z plane) of fin structure 204, while sidewall surface 244 and sidewall surface 246 are substantially vertical sides (for example, substantially parallel to the y-z plane) of fin structure 204.

The SEG process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The SEG process can use gaseous precursors (for example, Si-containing gases, such as SiH$_4$ and/or Ge-containing gases, such as GeH$_4$) and/or liquid precursors, which interact with a composition of fin structure 204. Dopants are introduced into the SEG process, such that SPD source/drain features 240 are in situ doped during the SEG process. For example, SPD source/drain features 240 are doped during deposition by adding dopants to a source material of the SEG process. In some implementations, where FinFET device 200 is configured as an n-type device (for example, having an n-channel), SPD source/drain features 240 include silicon or silicon carbon that is doped with phosphorous, arsenic, other n-type dopant, or combinations thereof (for example, forming Si:P epitaxial layers or Si:C:P epitaxial layers). In such implementations, SPD source/drain features 240 can have a phosphorous dopant concentration in a range from about $1 \times 10^{21}$ cm$^{-3}$ to about $4 \times 10^{21}$ cm$^{-3}$. In some implementations, where FinFET device 200 is configured as a p-type device (for example, having a p-channel), SPD source/drain features 240 include silicon germanium (SiGe) doped with boron, other p-type dopant, or combinations thereof (for example, forming a Si:Ge:B epitaxial layer). In such implementations, SPD source/drain features 240 can have a boron dopant concentration in a range from about $1\times10^{21}$ cm$^{-3}$ to about $4\times10^{21}$ cm$^{-3}$. In some implementations, SPD source/drain features 240 include materials and/or dopants that achieve desired tensile stress and/or compressive stress in channel region 206. In some implementations, dopant concentration in SPD source/drain features 240 over source region 207 and drain region 208 can be the same or different.

Figure 6A:
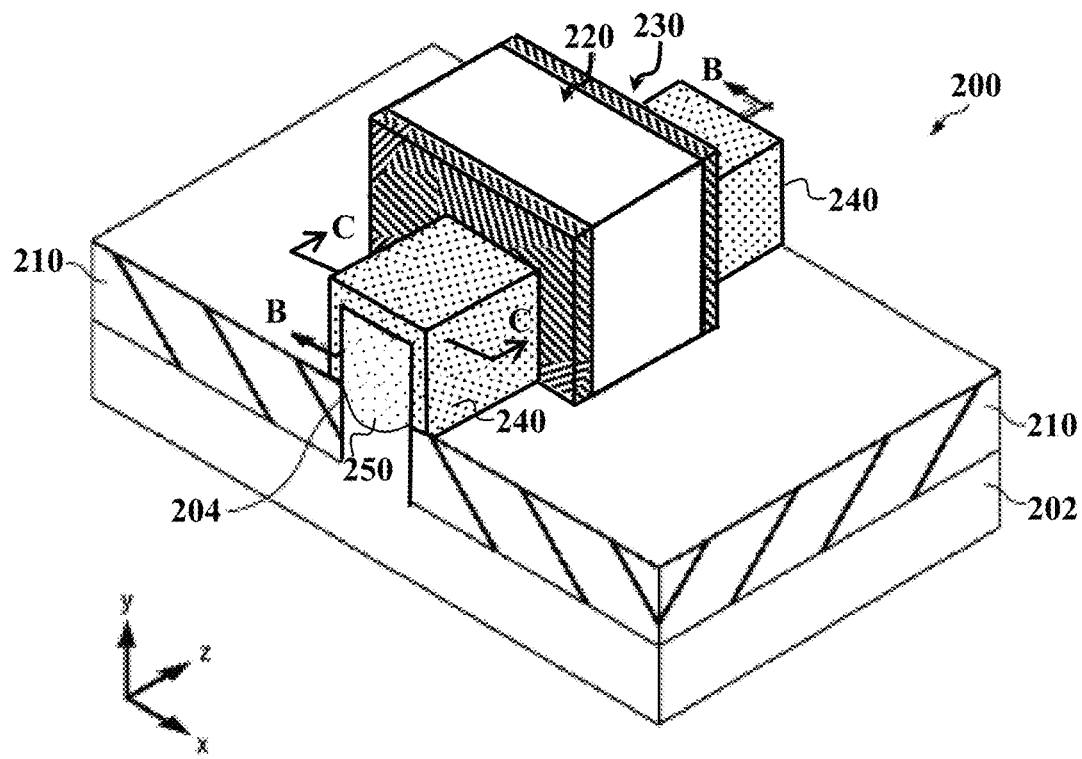
Figure 6B:
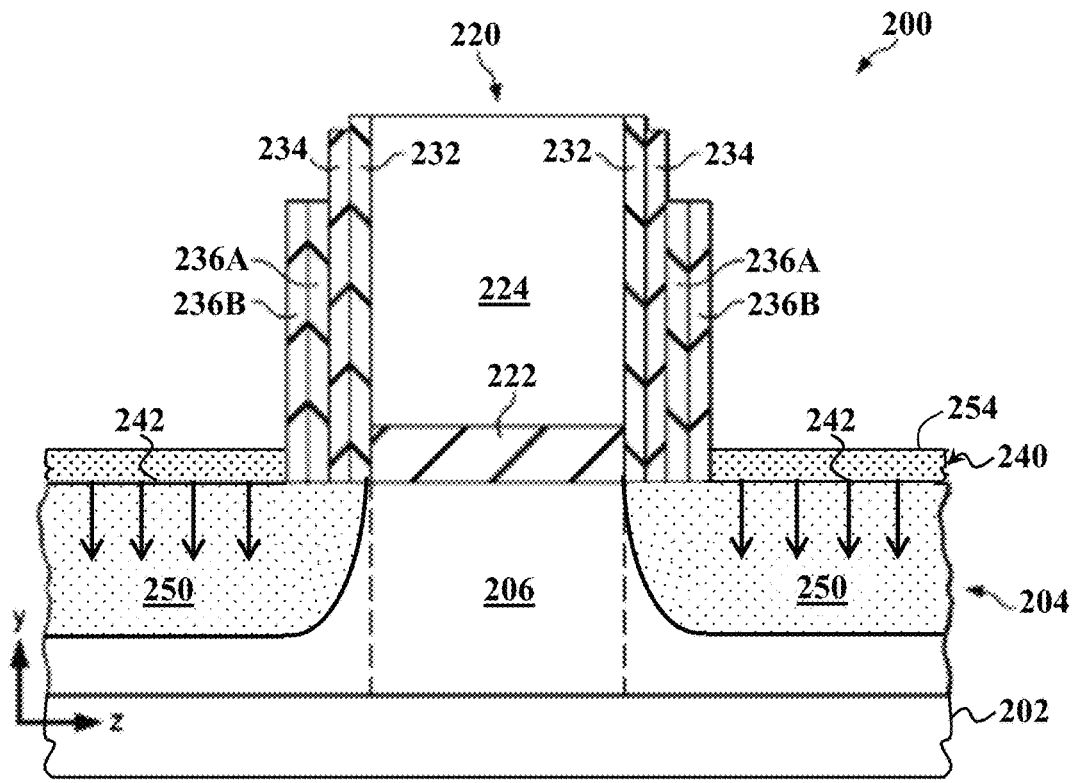

In FIGS. 6A-6C, an annealing process is performed. The annealing process causes dopant from SPD source/drain features 240 to diffuse into fin structure 204, particularly into source region 207 and drain region 208. In the depicted embodiment, the annealing process includes a microwave annealing (MWA) process that locally heats SPD source/drain features 240 relative to other features of FinFET device 200 (for example, surrounding structures and/or materials, such as fin structure 204), thereby activating dopants in SPD source/drain features 240 and causing activated dopants to diffuse from SPD source/drain features 240 into source region 207 and drain region 208. The MWA process can utilize ionic polarization, atomic polarization, electronic polarization, and/or interfacial polarization heating mechanisms to locally increase a temperature of SPD source/drain features 240 relative to fin structure 204 and/or gate structure 220. In some implementations, the MWA process utilizes interfacial polarization for activating the dopants, where interfacial polarization can be caused when free charges accumulated at interfaces located within SPD source/drain features 240 (such as at grain boundaries and/or phase boundaries) are exposed to microwave radiation, when defect regions in SPD source/drain features 240 are exposed to microwave radiation, and/or when free charges accumulated at interfaces located between SPD source/drain features 240 and fin structure 204 are exposed to microwave radiation. In some implementations, the MWA process is performed at a temperature in a range from about 500 degree Celsius (° C.) to about 750° C. In some implementations, the MWA process is performed with a power in a range from about 8 kilowatts (kW) to about 18 kW. In some implementations, the MWA process is performed for a time in a range from about 150 seconds to about 300 seconds. In some implementations, a frequency of microwave radiation during the MWA process is in a range from about 2 GHz to about 10 GHz.

Because SPD source/drain features 240 wrap source region 207 and drain region 208, dopants laterally diffuse and vertically diffuse into source region 207 and drain region 208 during the annealing process. For example, in FIG. 6B and FIG. 6C, dopant diffuse vertically from SPD source/drain features 240 disposed over top surface 242 into fin structure 204, and dopant diffuse laterally from SPD source/drain features 240 disposed over side surface 244 and side surface 246 into fin structure 204. Source region 207 and drain region 208 are thus uniformly doped to form heavily doped source/drain (HDD) features 250 in fin structure 204. In some implementations, HDD features 250 have a dopant concentration in a range from about $1\times10^{21}$ cm$^{-3}$ to about $4\times10^{21}$ cm$^{-3}$. Using SPD source/drain features to laterally and vertically dope source region 207 and drain region 208 achieves a uniform doping concentration throughout HDD features 250. In some implementations, a doping concentration in HDD features 250 is substantially the same across a width of HDD features 250 (for example, from sidewall surface 244 to sidewall surface 246). In some implementations, a doping concentration in HDD features 250 is substantially the same across a depth of heavily doped features 250 (for example, from top surface 242 to a boundary 252 of HDD features 250 (note that, in some implementations, HDD features 250 may extend from top surface 242 to substrate 202)). In some implementations, the doping concentration is considered substantially the same when the doping concentrations at any two points across the width of HDD features 250, at any two points across the depth of HDD features 250, and/or at any two points in HDD features 250 are within ±5% of each other. In various implementations, parameters of the MWA process (for example, temperature, power, and duration) can be selected based on a number of factors (for example, dopant concentration of SPD source/drain features 240 and/or dimensions of SPD source/drain features 240 and/or fin structure 204) to achieve a desired doping profile and/or doping concentration distribution of SPD source/drain features 240 and/or HDD features 250.

Figure 8:
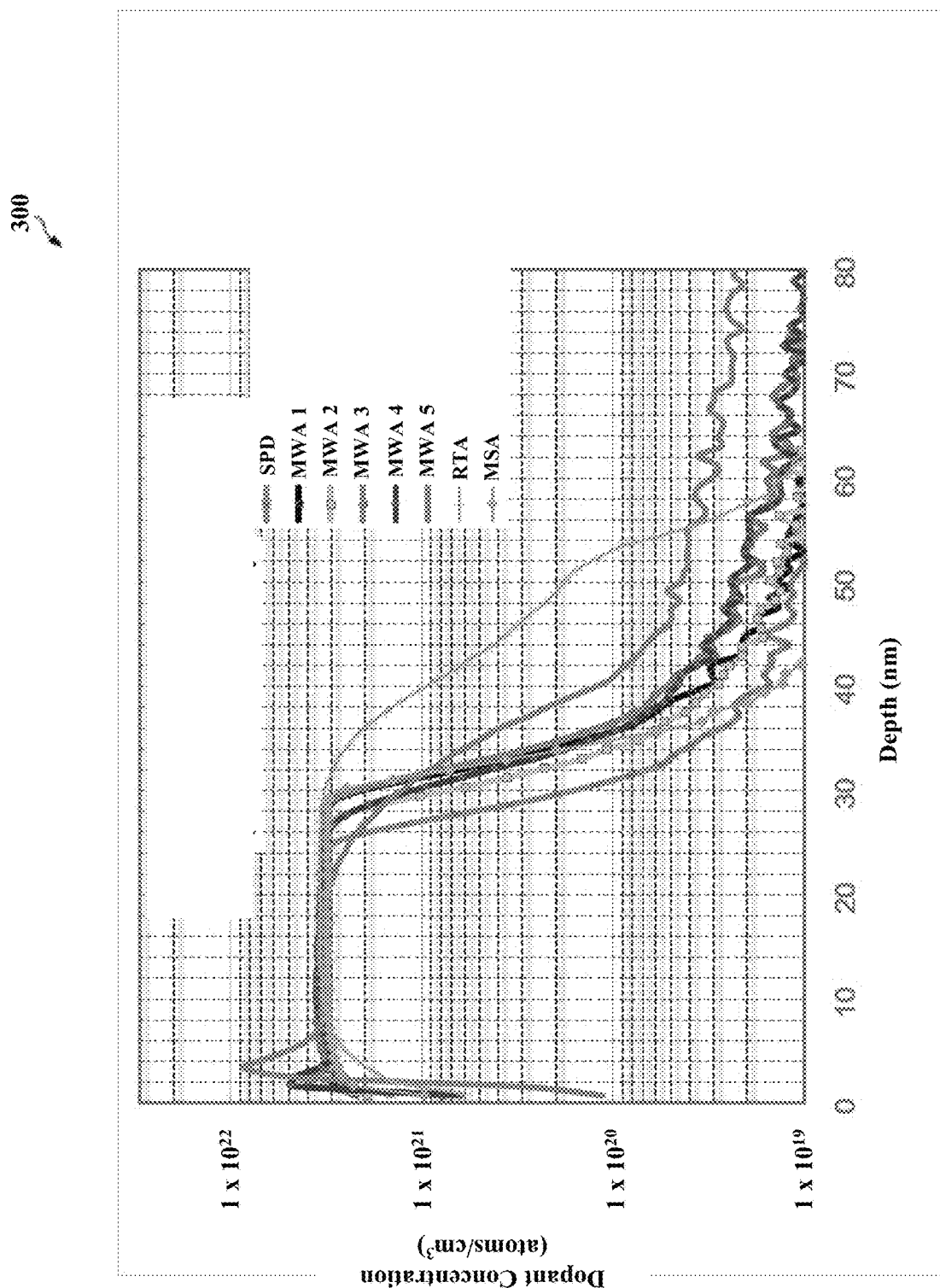
FIG. 8 illustrates a graph that depicts dopant concentration profiles achieved by applying different annealing processes to a solid phase diffusion layer according to various aspects of the present disclosure.

Turning to FIG. 8, FIG. 8 illustrates a graph 300 that depicts dopant concentration profiles achieved by applying different annealing processes to a solid phase diffusion layer (such as SPD source/drain features 240) based on Secondary Ion Mass Spectrometry (SIMS) analysis according to various aspects of the present disclosure. In graph 300, a dopant concentration (atoms/cm$^3$) is evaluated as a function of a depth (nm) from a surface of the solid phase diffusion layer. For purposes of discussion, various curves in graph 300 represent an n-type dopant concentration (for example, a phosphorous concentration) relative to a depth into fin structure 204 from a top surface 254 of SPD source/drain features 240. An SPD curve represents a doping concentration profile of SPD source/drain features 240 without applying any annealing processes; MWA 1, MWA 2, MWA 3, MWA 4 and MWA 5 curves represent doping concentration profiles of SPD source/drain features 240 after applying various MWA processes; a RTA curve represents a doping concentration profile of SPD source/drain features 240 after applying a rapid thermal anneal (RTA) process; and an MSA curve represents a doping concentration profile of SPD source/drain features 240 after applying a millisecond anneal (MSA) process. In some implementations, the various MWA processes associated with MWA 1, MWA 2, MWA 3, MWA 4 and MWA 5 curves were performed at a temperature in a range from about 500° C. to about 750° C., a power in a range from about 8 kW to about 18 kW, and a time of about 150 seconds to about 300 seconds; the RTA process was performed at a temperature in a range from about 900° C. to about 1,000° C. and a time of about 2 seconds; and the MSA process was performed at a temperature in a range from about 1,100° C. to about 1,200° C. and a time of about 2 milliseconds.

As shown by SPD curve, dopant concentration remains substantially the same from a depth of about 6 nm to about 24 nm, and begins decreasing abruptly from a depth of about 24 nm to about 40 nm. As shown by MWA 1, MWA 2, MWA 3, MWA 4 and MWA 5 curves, SPD source/drain features 240 exhibit box-like dopant profiles after applying MWA processes, where the MWA processes extend the depth of uniform dopant concentration. For example, dopant concentration remains substantially the same from a depth of about 6 nm to about 30 nm, yet abruptly decreases from a depth of about 30 nm to about 40 nm. In some implementations, the MWA processes are tuned to ensure that a slope of MWA 1, MWA 2, MWA 3, MWA 4 and MWA 5 curves decreases at about 3 nm to 4 nm per decade of dopant concentration. Such abrupt decrease ensures that the MWA process does not cause dopant to diffuse into channel region 206, thereby achieving desired dopant activation while maintaining low electrical resistance. For example, though the RTA curve indicates that the RTA process achieves a dopant concentration that remains substantially the same from a depth of about 6 nm to about 30 nm, the dopant concentration decreases much slower from a depth of about 30 nm to about 40 nm, such that the RTA process causes dopant to diffuse into channel region 206. Over diffusion caused by the RTA process results in short channel effects, thereby degrading performance of FinFET device 200.

Accordingly, by implementing an MWA process to diffuse dopant into source region 207 (and drain region 208), doped features (such as HDD features 250) exhibit substantially uniform dopant concentrations along top portions (in other words, along top surface 242) and sidewall portions (in other words, along side surface 244 and side surface 246) of fin structure 204, significantly lowering resistance between source region 207 (and drain region 208) and channel region 206, improving conductance in channel region 206, and overcoming shadowing effects experienced during ion implantation processes. Further, since SPD source/drain features 240 cover fin structure 204 in a manner that achieves lateral and vertical doping of the fin structure during the MWA process, a thickness of the SPD source/drain features 240 can be limited to prevent undesired merging between SPD source/drain features 240 formed on adjacent fin structures, overcoming challenges arising in doping techniques that recess fin structure 204. In some implementations, SPD source/drain features 240 have a thickness that ranges from about 1 nm to about 10 nm. In some implementations, SPD source/drain features 240 have a thickness that ranges from about 5 nm to about 8 nm. Different embodiments may have different advantages, and no particular advantage is necessarily required of any embodiment.

Figure 7A:
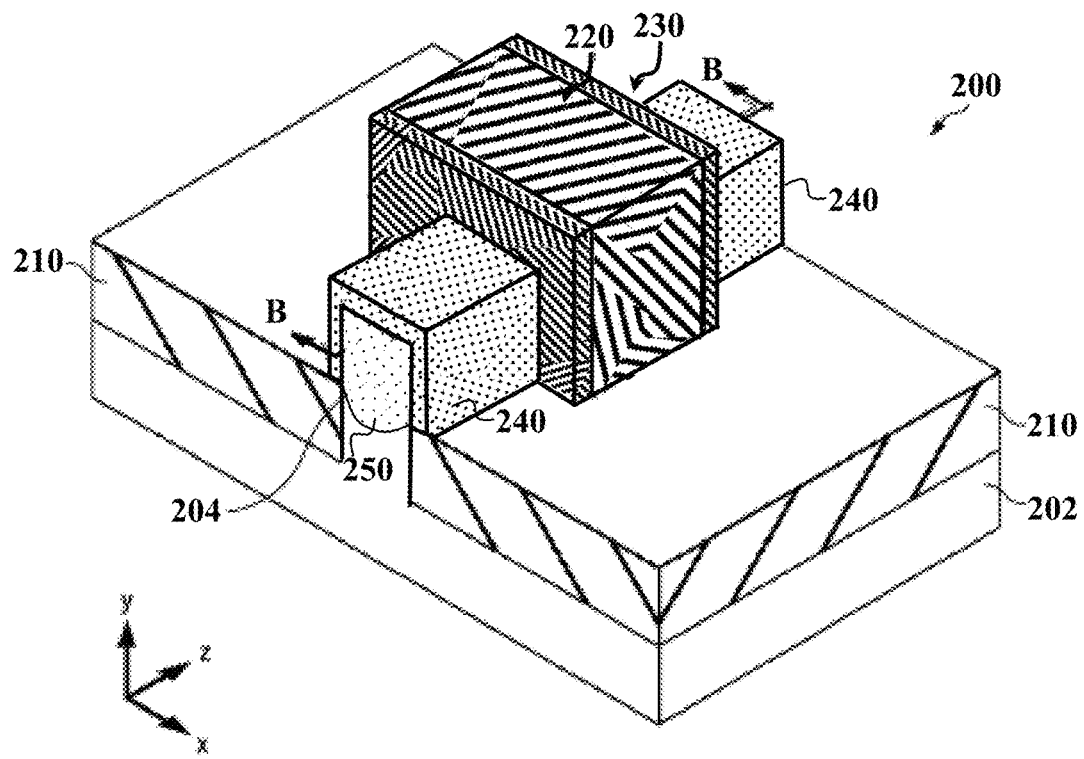
Figure 7B:
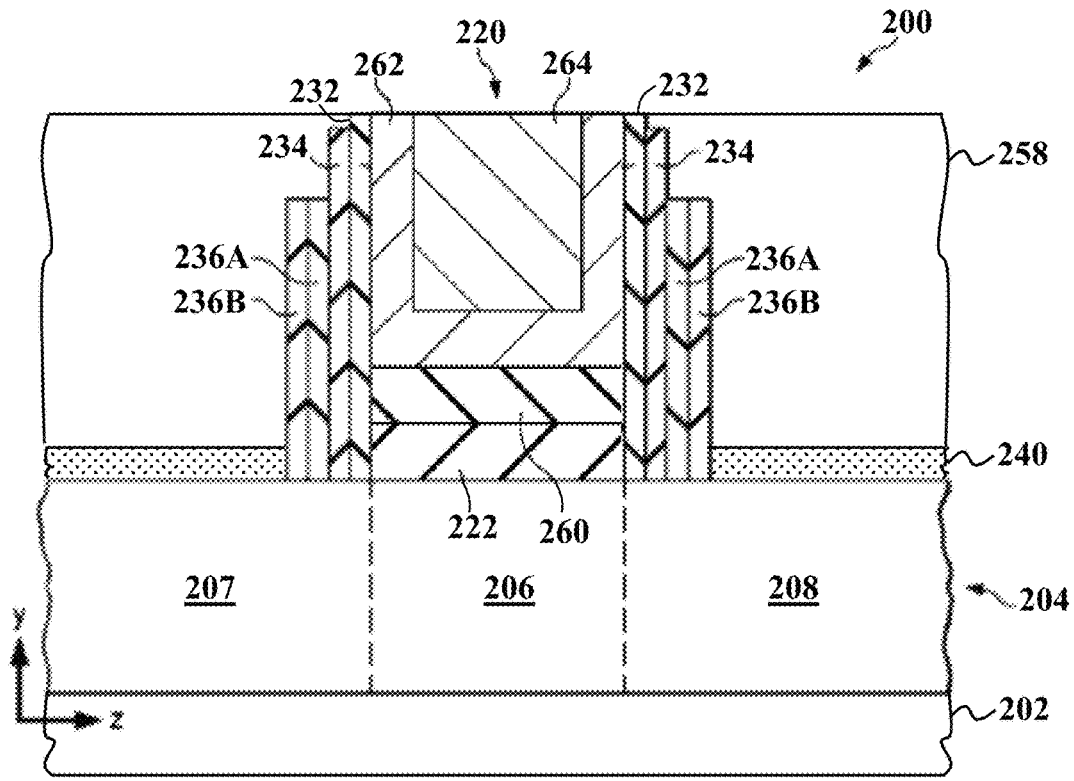

FinFET device 200 can undergo subsequent processing to complete fabrication. Turning to FIG. 7A and FIG. 7B, a gate replacement process is performed to replace a dummy gate stack of gate structure 220 with a gate, such as a metal gate stack. For example, an inter-level dielectric (ILD) layer 258 can be formed over substrate 202, for example, by a deposition process (such as CVD, PVD, ALD, HDPCVD, MOCVD, RPCVD, PECVD, LPCVD, ALCVD, APCVD, plating, other suitable methods, or combinations thereof). ILD layer 258 includes a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In the depicted embodiment, ILD layer 258 is a low-k dielectric layer. In some implementations, ILD layer 258 can include a multilayer structure having multiple dielectric materials. Subsequent to the deposition of ILD layer 258, a CMP process may be performed, such that a top portion of gate structure 220 is reached (exposed), such as a top portion of dummy gate electrode layer 224.

A portion of gate structure 220 (here, dummy gate electrode layer 224) is then removed, thereby forming a trench (opening) that exposes interfacial layer 222. In some implementations, an etching process selectively removes dummy gate electrode layer 224 (and, in some implementations, the dummy gate dielectric layer). The etching process is a dry etching process, a wet etching process, or combinations thereof. A selective etching process (such as a selective wet etch and/or a selective dry etch) can be tuned, such that dummy gate electrode layer 224 has an adequate etch rate relative to interfacial layer 222, seal spacers 226, offset spacers 228, dummy spacers 230, and/or ILD layer 250.

A metal gate stack of gate structure 220 is then formed in the opening (trench). The metal gate stack includes a gate dielectric (for example, a gate dielectric layer 260) and a gate electrode (for example, a work function layer 262 and a metal fill layer 264). The metal gate stack of gate structure 220 may include numerous other layers, for example, capping layers, interface layers, diffusion layers, barrier layers, hard mask layers, or combinations thereof. In FIG. 7A and FIG. 7B, gate dielectric layer 260 is formed over interfacial layer 222, and the gate electrode (here, work function fill layer 262 and metal fill layer 264) is formed over gate dielectric layer 260. Gate dielectric layer 260 includes a dielectric material, such as silicon oxide, high-k dielectric material, other suitable dielectric material, or combinations thereof. Examples of high-k dielectric material include $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, gate dielectric layer 260 is a high-k dielectric layer. In some implementations, where interfacial layer 222 is omitted from FinFET device 200, gate dielectric layer 260 can include an interfacial layer (such as a silicon oxide layer), and a high-k dielectric layer disposed over the interfacial layer. The gate electrode includes a conductive material, such as polysilicon, Al, Cu, Ti, Ta, W, Mo, TaN, NiSi, CoSi, TiN, WN, TiAl, TiAlN, TaCN, TaC, TaSiN, other conductive material, or combinations thereof. In depicted embodiment, the gate electrode includes work function layer 262, which is a conductive layer tuned to have a desired work function (such as an n-type work function or a p-type work function), and a metal fill layer 264, which is a conductive layer formed over work function layer 262. In some implementations, work function layer 262 includes n-type work function materials, such as Ti, Ag, TaAl, TaAlC, TiAlN, TaC, TaCN, TaSiN, Mn, Zr, other suitable n-type work function materials, or combinations thereof. In some implementations, work function layer 262 includes a p-type work function material, such as TiN, TaN, Ru, Mo, Al, WN, $ZrSi_2$, $MoSi_2$, $TaSi_2$, $NiSi_2$, WN, other suitable p-type work function materials, or combinations thereof. Metal fill layer 264 includes a suitable conductive material, such as aluminum, tungsten, or copper. Metal fill layer 264 may additionally or collectively include polysilicon, titanium, tantalum, metal alloys, other suitable materials, or combinations thereof. Gate dielectric layer 260, work function layer 262, and metal fill layer 264 are formed by various deposition processes, such as ALD, CVD, PVD, and/or other suitable process. In some implementations, work function layer 262 and metal fill layer 264 may conform to exposed surfaces in the opening, providing work function layer 262, and metal fill layer 264 as depicted. CMP process can be performed to remove excess material (such as excess work function layer 262 and/or metal fill layer 264), planarizing gate structure 220.

Various contacts can be formed to facilitate operation of FinFET device 200. For example, an ILD layer, similar to ILD layer 258, can be formed over substrate 202 (in some implementations, over ILD layer 258 and gate structure 220). Contacts can then be formed in ILD layer 258 and/or ILD layers disposed over ILD layer 258. For example, a contact is electrically coupled with gate structure 220 of FinFET device 200 (particularly, the gate electrode, such as work function layer 262 and/or metal fill layer 264), a contact is electrically coupled to source region 207 (particularly, SPD source/drain feature 240), and a contact is electrically coupled to drain region 208 (particularly, SPD source/drain feature 240). Contacts include a conductive material, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, ILD layer 258, ILD layers disposed over ILD layer 258, and contacts (for example, extending through ILD layers 258 and/or other ILD layers) are a portion of a multilayer interconnect (MLI) feature disposed over substrate 202. The MLI feature electrically couples various components of FinFET device 200, such that the various components are operable to function as specified by design requirements of FinFET device 200. The MLI feature can include a combination of metal layers and ILD layers configured to form vertical interconnect features, such as contacts and/or vias, and/or horizontal interconnect features, such as lines. The various conductive features include materials similar to the contacts. In some implementations, a damascene process and/or dual damascene process is used to form a copper-based multilayer interconnection structure.

The present disclosure provides for many different embodiments. Exemplary source and drain formation techniques for fin-like field effect transistors (FinFETs) are disclosed herein. For example, a method includes forming a fin structure, wherein the fin structure include a channel region disposed between a source region and a drain region; forming a gate structure over the channel region of the fin structure; forming a solid phase diffusion (SPD) layer over the source region and the drain region of the fin structure; and performing a microwave annealing (MWA) process to diffuse a dopant from the SPD layer into the source region and the drain region of fin structure. In some implementations, the SPD layer is disposed over the fin structure, such that the dopant diffuses laterally and vertically into the source region and the drain region to form heavily doped source/drain features.

In some implementations, the method further includes forming spacers adjacent to the gate structure before forming the SPD layer. In some implementations, the method further includes replacing a dummy gate of the gate structure with a metal gate. In some implementations, no lightly doped source and drain (LDD) features are formed in the source region and the drain region of the fin structure. In some implementations, the method further includes tuning the MWA process such that dopant diffuses from the SPD layer into the source region and the drain region according to a box-like dopant profile. In some implementations, the MWA process is performed with a temperature in a range from about 500° C. to about 750° C., a power in a range from about 8 kW to about 18 kW, and a time of about 150 seconds to about 300 seconds. In some implementations, doping concentrations at any two points within the doped feature are within ±5% of each other. In some implementations, the SPD layer has a thickness in a range from about 1 nm to about 10 nm.

Another exemplary method includes forming a projection extending upwardly from a substrate, the projection having a first portion, a second portion, and a third portion, wherein the second portion is disposed between the first portion and the third portion. The method further includes forming a solid phase dopant diffusion (SPD) layer over the first portion and the third portion, such that the SPD layer wraps the first portion and the third portion, and performing a microwave annealing (MWA) process on the SPD layer, thereby doping the first portion and the third portion. In some implementations, the method further includes forming a gate structure over the second portion, such that the gate structure wraps the second portion. In some implementations, the gate structure includes a dummy gate, and the method further includes replacing the dummy gate with a metal gate after performing the MWA process.

In some implementations, the SPD layer is formed by performing a selective epitaxial growth (SEG) process to grow a semiconductor material over the first portion and the third portion. In some implementations, the semiconductor material is in situ doped during the SEG process. In some implementations, the SPD layer includes silicon doped with phosphorous, and the MWA process causes the phosphorous to diffuse into the first portion and the third portion. In some implementations, the SPD layer includes silicon germanium doped with boron, and the MWA process causes the boron to diffuse into the first portion and the third portion.

Another exemplary method includes forming a fin structure over a substrate. The fin structure includes a channel region disposed between a source region and a drain region. The source region and the drain region of the fin structure include an intrinsic semiconductor material. The method further includes forming a gate structure over the channel region of the fin structure, such that the gate structure interposes the source region and the drain region of the fin structure. The method further includes epitaxially growing a doped semiconductor material over the intrinsic semiconductor material of the source region and the drain region of the fin structure. The method further includes performing a microwave annealing (MWA) process to diffuse a dopant from the doped semiconductor material into the intrinsic semiconductor material of the source region and the drain region of fin structure.

In some implementations, the doped semiconductor material is disposed on at least one lateral surface and at least one vertical surface of the source region and the drain region, such that the dopant laterally and vertically diffuses into the source region and the drain region during the MWA process. In some implementations, the method further includes tuning the MWA process such that dopant diffuses from the SPD layer into the source region and the drain region according to a box-like dopant profile. In some implementations, the method further includes performing a gate replacement process after performing the MWA process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a semiconductor fin structure on a substrate;
   forming a first gate structure over the fin structure, wherein the first gate structure includes a first gate electrode;
   after forming the first gate structure over the fin structure, forming a doped layer along a sidewall and a top surface of the fin structure, the top surface facing away from the substrate and interfacing with the sidewall;
   performing a microwave annealing (MWA) process to laterally and vertically diffuse a dopant from the doped layer into the fin structure;
   removing the first gate electrode to form a trench after the performing of MWA process; and
   forming a second gate electrode in the trench.

2. The method of claim 1, wherein a dopant feature is formed in the fin structure by the performing of the MWA process to laterally and vertically diffuse the dopant from the doped layer into the fin structure, and
   wherein the dopant feature has a uniform doping concentration.

3. The method of claim 1, wherein the forming of the doped layer along the sidewall and the top surface of the fin structure includes performing an epitaxially growing process to form the doped layer along the sidewall and the top surface of the fin structure.

4. The method of claim 3, wherein the forming of the doped layer along the sidewall and the top surface of the fin structure further includes introducing the dopant into the epitaxially growing process.

5. The method of claim 1, wherein the MWA process is performed with a temperature in a range from about 500° C. to about 750° C.

6. A method comprising:
   forming a fin structure on a substrate, the fin structure including a first sidewall and an opposing second sidewall, wherein a first portion of a dielectric isolation feature is disposed along the first sidewall of the fin structure and a second portion of the dielectric isolation feature is disposed along the second sidewall of the fin structure;
   forming a doped layer along the first sidewall, the second sidewall and a top surface of the fin structure, the top surface of the fin structure facing away from the substrate and extending between the first sidewall and the second sidewall of the fin structure; and
   performing a microwave annealing (MWA) process to laterally and vertically diffuse a dopant from the doped layer into the fin structure thereby forming a doped feature in the fin structure, wherein the doped feature extends within the fin structure between the first portion of the dielectric isolation feature and the second portion of the dielectric isolation feature.

7. The method of claim 6, wherein the doped feature has the dopant at a concentration ranging from about $1\times10^{21}$ cm$^{-3}$ to about $4\times10^{21}$ cm$^{-3}$.

8. The method of claim 6, wherein the doped feature extends within the fin structure below a top surface of the first portion of the dielectric isolation feature.

9. The method of claim 6, wherein the MWA process is performed with a temperature in a range from about 500° C. to about 750° C., a power in a range from about 8 kW to about 18 kW, and a time of about 150 seconds to about 300 seconds.

10. The method of claim 6, wherein the forming of the doped layer along the first sidewall, the second sidewall and the top surface of the fin structure includes forming a first portion of the doped layer over a source region of the fin structure and a second portion of the doped layer over a drain region of the fin structure.

11. The method of claim 10, wherein the doped layer does not extend continuously from the first portion of the doped layer to the second portion of the doped layer.

12. The method of claim 10, wherein the first portion of the doped layer includes the dopant at a first concentration and the second portion of the doped layer includes the dopant at a second concentration that is different from the first concentration.

13. A method comprising:
    forming a semiconductor fin structure on a substrate;
    forming a doped layer along a sidewall and a top surface of the fin structure, the top surface facing away from the substrate;
    performing a microwave annealing (MWA) process to laterally and vertically diffuse a dopant from the doped layer into the fin structure thereby forming a uniformly doped feature in the fin structure;
    forming a gate dielectric layer on the fin structure after the performing of the MWA process; and
    forming a gate electrode layer on the gate dielectric layer.

14. The method of claim 13, wherein the doped layer includes a semiconductor material.

15. The method of claim 13, wherein the forming of the doped layer along the sidewall and the top surface of the fin structure includes forming a first portion of the doped layer over a first source/drain region of the fin structure and a second portion of the doped layer over a second source/drain region of the fin structure.

16. The method of claim 15, wherein a channel region of the fin structure is disposed between the first source/drain region of the fin structure and the second source/drain region of the fin structure, and
    wherein the channel region of the fin structure is free of the doped layer after the forming of the doped layer along the sidewall and the top surface of the fin structure.

17. The method of claim 13, wherein the MWA process is performed with a temperature in a range from about 500° C. to about 750° C. and a time of about 150 seconds to about 300 seconds.

18. The method of claim 13, wherein the sidewall of the fin structure is a first sidewall and the fin structure further includes an opposing second sidewall,
    wherein a first portion of a dielectric isolation feature is disposed along the first sidewall of the fin structure and a second portion of the dielectric isolation feature is disposed along the second sidewall of the fin structure, and
    wherein the uniformly doped feature extends within the fin structure between the first portion of the dielectric isolation feature and the second portion of the dielectric isolation feature after the performing of the MWA process.

19. The method of claim 1, wherein the forming of the doped layer along the sidewall and the top surface of the fin structure includes forming the doped layer on the fin structure on opposite sides of the first gate structure.

20. The method of claim 1, wherein a dopant feature is formed in the fin structure by the performing of the MWA process to laterally and vertically diffuse the dopant from the doped layer into the fin structure, wherein the sidewall of the fin structure is a first sidewall and the fin structure further includes an opposing second sidewall, wherein a first portion of a dielectric isolation feature is disposed along the first sidewall of the fin structure and a second portion of the dielectric isolation feature is disposed along the second sidewall of the fin structure, and wherein the doped feature extends within the fin structure between the first portion of the dielectric isolation feature and the second portion of the dielectric isolation feature after the performing of the MWA process.

\* \* \* \* \*